(12) United States Patent
Chen et al.

(10) Patent No.: US 9,780,031 B2
(45) Date of Patent: Oct. 3, 2017

(54) WIRING STRUCTURES

(71) Applicant: INTERNATIONAL BUSINESS MACHINES CORPORATION, Armonk, NY (US)

(72) Inventors: Fen Chen, Williston, VT (US); Cathryn J. Christiansen, Huntington, VT (US); Roger A. Dufresne, Fairfax, VT (US); Charles W. Griffin, Jericho, VT (US)

(73) Assignee: GLOBALFOUDRIES INC., Grand Cayman (KY)

( * ) Notice: Subject to any disclaimer, the term of this patent is extended or adjusted under 35 U.S.C. 154(b) by 340 days.

(21) Appl. No.: 14/477,535

(22) Filed: Sep. 4, 2014

(65) Prior Publication Data

US 2016/0071790 A1  Mar. 10, 2016

(51) Int. Cl.
*H01L 23/528* (2006.01)
*H01L 23/522* (2006.01)

(52) U.S. Cl.
CPC .......... *H01L 23/528* (2013.01); *H01L 23/522* (2013.01); *H01L 2924/0002* (2013.01)

(58) Field of Classification Search
CPC ............. H01L 23/5222; H01L 23/5228; H01L 23/528
See application file for complete search history.

(56) References Cited

U.S. PATENT DOCUMENTS

| | | | |
|---|---|---|---|
| 3,879,840 A | 4/1975 | Ames et al. | |
| 4,962,060 A | 10/1990 | Sliwa et al. | |
| 5,382,831 A | 1/1995 | Atakov et al. | |
| 5,689,139 A | 11/1997 | Bui et al. | |
| 5,751,056 A | 5/1998 | Numata | |
| 6,191,481 B1 | 2/2001 | Bothra et al. | |
| 6,489,684 B1 * | 12/2002 | Chen ................. | H01L 21/76838 257/773 |
| 6,831,365 B1 | 12/2004 | Yao et al. | |
| 7,031,163 B2 | 4/2006 | Lee et al. | |
| 7,087,516 B2 | 8/2006 | Hau-Riege | |
| 7,301,236 B2 * | 11/2007 | Greco ................. | H01L 23/5226 257/758 |
| 7,339,274 B2 | 3/2008 | Desko, Jr. et al. | |
| 7,439,173 B2 | 10/2008 | Greco et al. | |
| 7,994,640 B1 | 8/2011 | Alers et al. | |
| 2008/0217735 A1 | 9/2008 | Chen et al. | |

* cited by examiner

*Primary Examiner* — Charles Garber
*Assistant Examiner* — Krista Soderholm
(74) *Attorney, Agent, or Firm* — David Cain; Andrew M. Calderon; Roberts Mlotkowski Safran Cole & Calderon P.C.

(57) ABSTRACT

Wiring structures with dummy metal features and methods of manufacture are disclosed. A structure includes a metal wiring structure, and dummy metal features in electrical and direct physical contact with the metal wiring structure in a same plane as the metal wiring structure. The dummy metal features do not change a resistance of the metal wiring structure and are remote from other structures.

17 Claims, 4 Drawing Sheets

WIRING STRUCTURES

FIELD OF THE INVENTION

The invention relates to semiconductor structures and, more particularly, to wiring structures with dummy metal features and methods of manufacture.

BACKGROUND

Electromigration (EM) is the result of momentum transfer from electrons which move in the applied electric field, to ions which make up the lattice of the interconnect material. The effect is important in applications where high direct current densities are used, such as in microelectronics and related structures.

As the structure size in integrated circuits (ICs) decreases, the practical significance of EM effect increases. That is, continued miniaturization of ICs which are subject to increasingly high current become more prone to EM failure. For example, EM can lead to the electrical failure of interconnects and/or metal wiring in relatively short times, reducing the lifetime of the IC.

Thus, with the continuing aggressive scaling of interconnect dimensions and introduction of new lower k dielectric materials, the back end of the line (BEOL) interconnect reliability margins of EM is significantly reduced. In fact, EM is of increasing concern at new technologies because wire cross-section scales by 50% from each node, but circuit voltage and liner thickness do not scale at the same rate. Therefore, even greater current density is imposed for the interconnect wires at new technology nodes. Besides the geometry shrinkage, process induced challenges such as Cu microstructure degradation could further aggravate the EM problem.

SUMMARY

In an aspect of the invention, a structure comprises a metal wiring structure, and dummy metal features in electrical and direct physical contact with the metal wiring structure in a same plane as the metal wiring structure. The dummy metal features do not change a resistance of the metal wiring structure and are remote from other structures.

In an aspect of the invention, a structure comprises: a metal wiring structure at a predetermined wiring level of an integrated circuit; and dummy metal features in electrical and direct physical contact with the metal wiring structure in a same plane as the metal wiring structure. The dummy metal features and the metal wiring structure have a same thickness and are made of a same metal material. A wiring resistance of the metal wiring structure is approximately the same as a wiring structure devoid of the dummy metal features. The metal wiring structure has approximately a 2× improvement in electromigration lifetime compared to a wiring structure of a same dimension which is devoid of the dummy metal features.

In an aspect of the invention, a method comprises: forming a pattern in an opening corresponding to a wiring structure and dummy metal features at a same wiring level; and depositing metal material opening corresponding to the wiring structure and the dummy metal features to form the wiring structure and the dummy metal features in a same plane and in direct physical and electrical contact therewith.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to metal wiring with dummy metal features and methods of manufacture. In more specific embodiments, the present invention is directed to long and narrow wiring structures with dummy metal features extending within the same plane as the wiring structures. Advantageously and unexpectedly, the dummy metal features extending within the same plane as the wiring structure effectively improves EM performance from an interconnect design point of view, without impacting the resistance of the wiring structure. Accordingly, by placing dummy metal features locally onto critical wires which are long but carry high current density, it is now possible to substantially improve EM resistance of such wires and, hence, improve overall chip performance by allowing higher current density while still maintaining the required EM reliability for the entire chip.

The structures of the present invention can be manufactured in a number of ways using a number of different tools. In general, though, the methodologies and tools are used to form structures with dimensions in the micrometer and nanometer scale. The methodologies, i.e., technologies, employed to manufacture the metal wiring with dummy metal features of the present invention have been adopted from integrated circuit (IC) technology. For example, the structures of the present invention are built on wafers and are realized in films of material patterned by photolithographic processes on the top of a wafer. In particular, the fabrication of the metal wiring with dummy metal features of the present invention uses basic building blocks, including: (i) deposition of thin films of material on a substrate, (ii) applying a patterned mask on top of the films by photolithographic imaging, and (iii) etching the films selectively to the mask.

Figure 1:
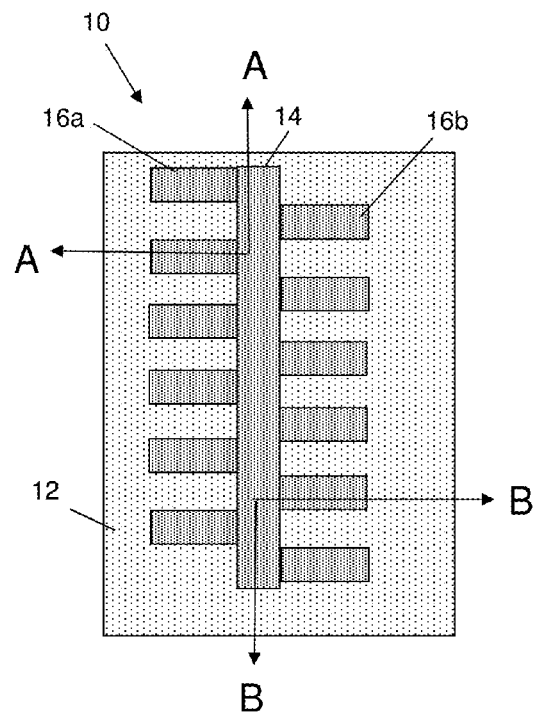
FIG. 1 shows a structure and respective fabrication processes according to an aspect of the present invention.

FIG. 1 shows a structure and respective fabrication processes according to an aspect of the present invention. More specifically, FIG. 1 shows a top-down plan view of a structure 10 in accordance with the invention. The structure 10 includes a wiring structure 14 with dummy metal features 16a, 16b, within the same wiring level, i.e., in a plane of the wiring structure 14. As shown in FIG. 1, the dummy metal features 16a, 16b extend from opposing sides of the wiring structure 14 along its longitudinal axis. In embodiments, the wiring structure 14 with dummy metal features 16a, 16b can be formed in a dielectric material at any metal layer, Mx, 12.

Advantageously, the wiring structure 14 with dummy metal features 16a, 16b can be formed with a single mask, using conventional CMOS processes, e.g., deposition, lithography and etching processes.

By way of example, an interlevel dielectric layer 12, e.g., oxide, can be patterned using a lithography process. In the lithography process, a photoresist is deposited on the interlevel dielectric layer 12 (at any desired layer), and exposed to energy (e.g., light) in order to form a pattern. Through conventional etching processes, e.g., reactive ion etching (RIE) with appropriate chemistries, a corresponding pattern openings is formed in the interlevel dielectric layer 12. The photoresist can then be removed by conventional stripping techniques, e.g., oxygen ashing.

A metal, e.g., copper lined with Ta or TaN, is then deposited in the openings. It should be understood that other metals and liners are also contemplated by the present invention, as should be known to those of ordinary skill in the art, e.g., cobalt, tungsten, etc. The metal can be deposited using any conventional deposition method such as chemical vapor deposition (CVD), plasma enhanced CVD (PECVD), physical vapor deposition (PVD), electroplating, etc. After deposition, the metal can be planarized using a conventional chemical mechanical polishing step. In this way, the wiring structure 14 with dummy metal features 16a, 16b is formed on the same wiring level, with a same thickness or depth. Additional back end of the line (BEOL) processes can continue.

In embodiments, the dummy metal features 16a, 16b can be provided in many different patterns or shapes, within the same plane as the wiring structure 14. For example, as shown in FIG. 1, the dummy metal features 16a, 16b are provided in a staggered configuration. Although only one exemplary configuration is shown, one of skill in the art should understand that the dummy metal features 16a, 16b can be provided, for example, on a single side of the wiring structure 14 in the same or different shape, on both sides of the wiring structure 14 in different patterns and/or different shapes, etc. In any of these scenarios, though, the wiring structure 14 and the dummy metal features are provided in a same plane using a single masking operation, with a common deposition.

Figures 2A, 2B:
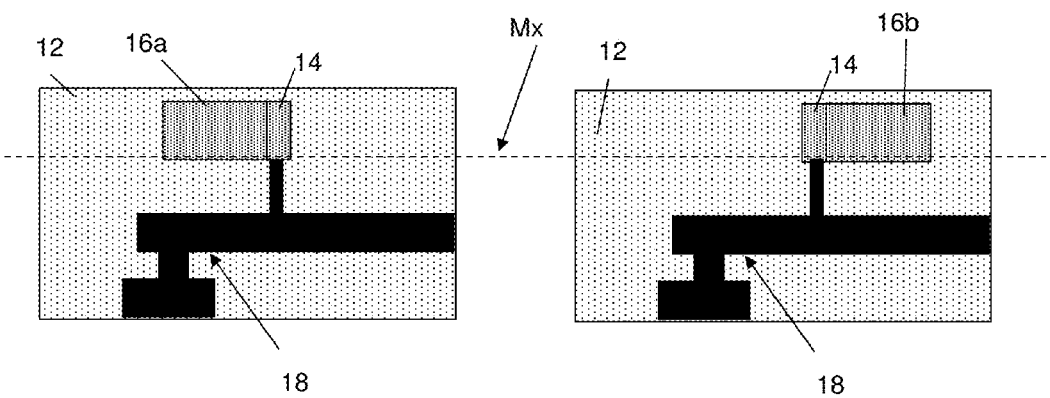
FIGS. 2a and 2b show respective cross sectional views of the structure of FIG. 1.

FIGS. 2a and 2b show respective cross sectional views of the structure of FIG. 1. FIG. 2a is a cross-sectional view of the structure of FIG. 1 along line A-A; whereas, FIG. 2b is a cross sectional view of the structure of FIG. 1 along line B-B. As shown in these figures, the dummy metal features 16a, 16b are provided in a same plane as the wiring structure 14, within the dielectric material 12. The dummy metal features 16a, 16b and the wiring structure 14 can be provided at any wiring level, Mx, with the wiring structure 14 being in direct physical and electrical contact with other wiring structures representatively shown as reference numeral 18. In embodiments, the dummy metal features 16a, 16b are not connected to any structures, e.g., other wires, vias, or devices. That is, the dummy metal features 16a, 16b only electrically contact the wiring structure 14. The dummy metal features 16a, 16b can also be strategically placed in any "white" or unused space adjacent to the wiring structure 14, in order to reduce area usage. Also, as shown in FIGS. 2a and 2b, the wiring structure 14 is devoid of any dummy vias.

Figure 3:
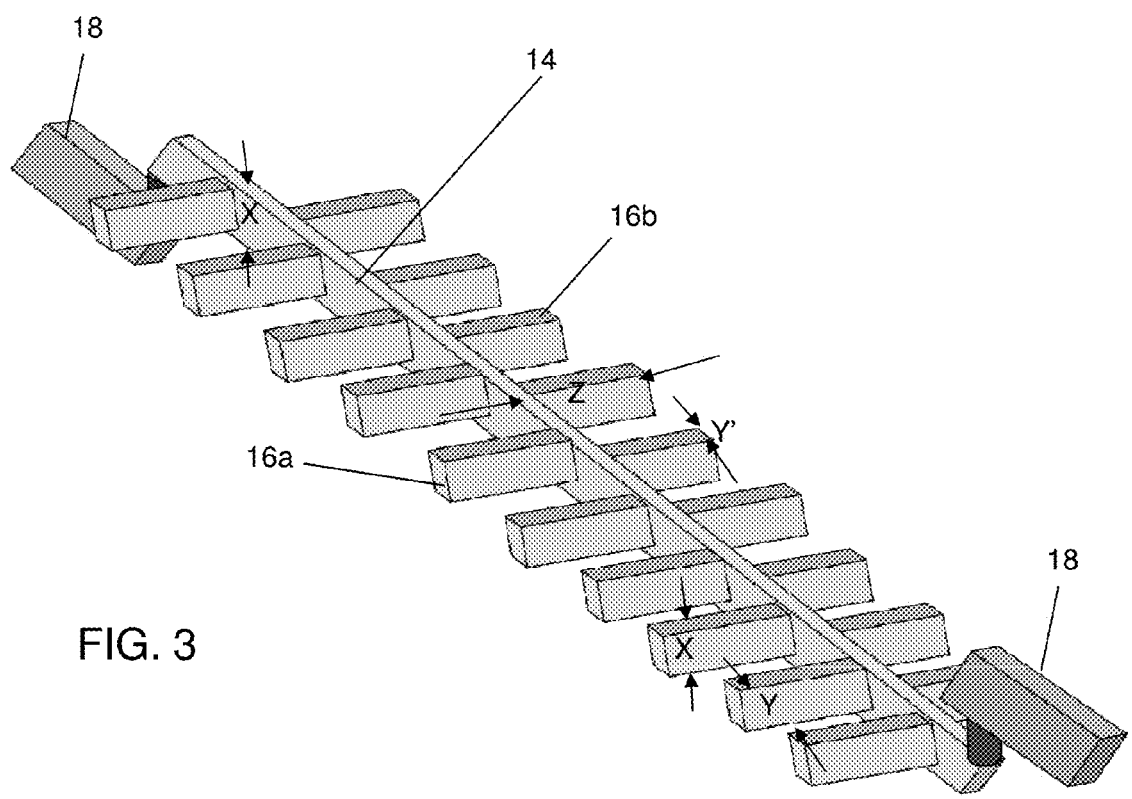
FIG. 3 shows an illustrative exploded view of the structure of FIG. 1 according to an aspect of the present invention.

FIG. 3 shows an illustrative exploded view of the structure of FIG. 1 according to an aspect of the present invention. More specifically, FIG. 3 shows the dummy metal features 16a, 16b in a staggered configuration on both sides (opposing sides) of the wiring structure 14, in a same plane and along its longitudinal axis. As noted above, the dummy metal features 16a, 16b are not in electrical contact with any metal features; instead, the wiring structure 14 is connected to additional wiring features 18 on different levels of the device, e.g., above and/or below. Also, it should be understood by those of skill in the art that the dummy metal features 16a, 16b are in direct electrical and physical contact with the wiring structure 14.

As further shown in FIG. 3, the dummy metal features 16a, 16b and wiring structure 14 can have certain dimensions, as designed by "X", "Y", "Y'" and "Z". More particularly, (i) the thickness "X" of the dummy metal features 16a, 16b and the wiring structure 14 is preferably the same, e.g., can be about 60 nm;

(ii) the distance "Y" between each of the dummy metal features 16a, 16b can be about 5 microns;

(iii) the width "Y'" of the dummy metal features 16a, 16b can be about 32 nm; and (iv) the length "Z" of each of the dummy metal features 16a, 16b can be about 5 microns.

It should be recognized by those of skill in the art that other dimensions are also contemplated by the present invention, depending on many different factors including the technology node, desired performance, e.g., resistance, capacitance, etc. Also, the use of the dummy metal features 16a, 16b are particularly advantageous with wiring structures 14 of more than 10 microns in length and less than 0.1 microns in width, e.g., long and narrow wiring structures 14. The dummy metal features 16a, 16b are in electrical and direct physical contact with the wiring structure 14 in a same plane as the metal wiring structure. Also, the dummy metal features do not change a resistance of the wiring structure 14 and is remote from other structures.

Figure 4:
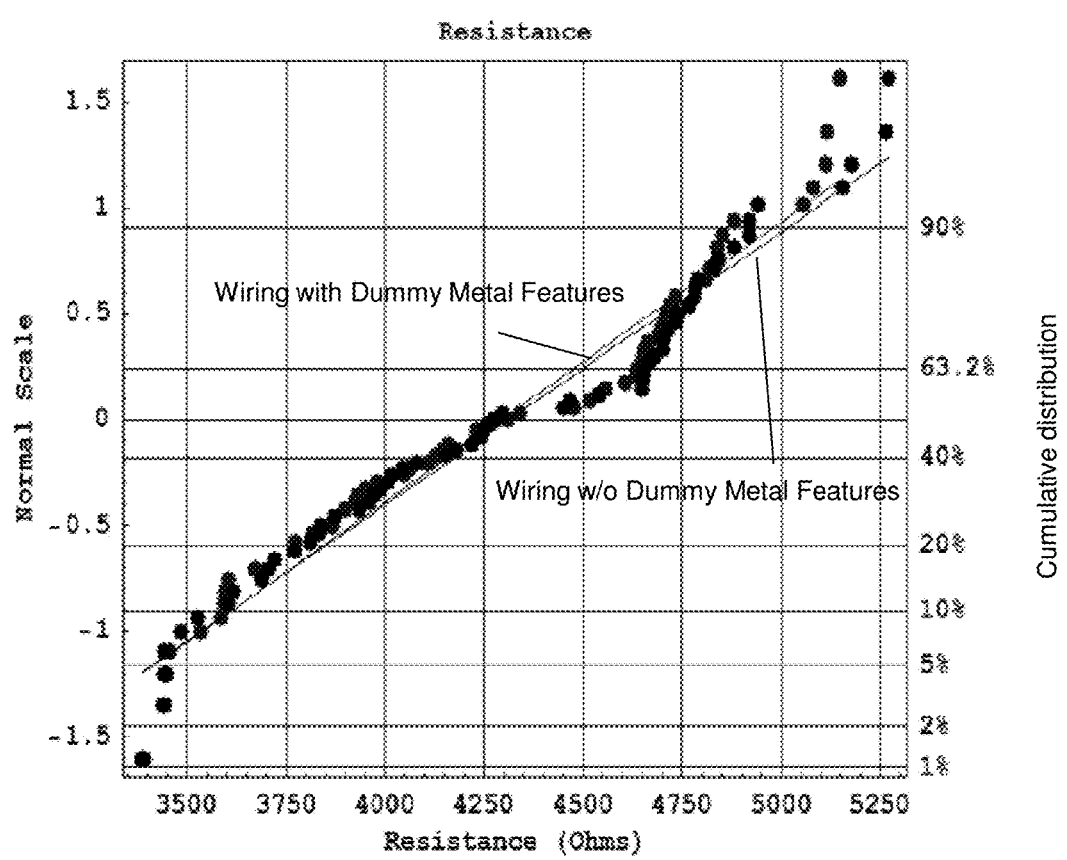
FIG. 4 shows a graph of resistance impact, comparing the wiring structure of the present invention to a conventional wiring structure devoid of dummy metal features.

FIG. 4 shows a graph of resistance impact, comparing the wiring structure of the present invention to a conventional wiring structure devoid of dummy metal features. In more particularity, the graph of FIG. 4 shows a comparison of the structure of FIG. 3 (with the dimensions noted therein) and a conventional wiring structure devoid of dummy metal features. The conventional wiring structure, otherwise, has the same dimensions as the wiring structure of the present invention. As shown in FIG. 4, it was unexpectedly found that adding additional metal (e.g., dummy metal features) will not affect the resistance of the wiring. For example, as shown in FIG. 4, the use of the dummy metal features does not change active structure resistance, which is surprising since additional metal is being used with the metal wiring.

Figure 5:
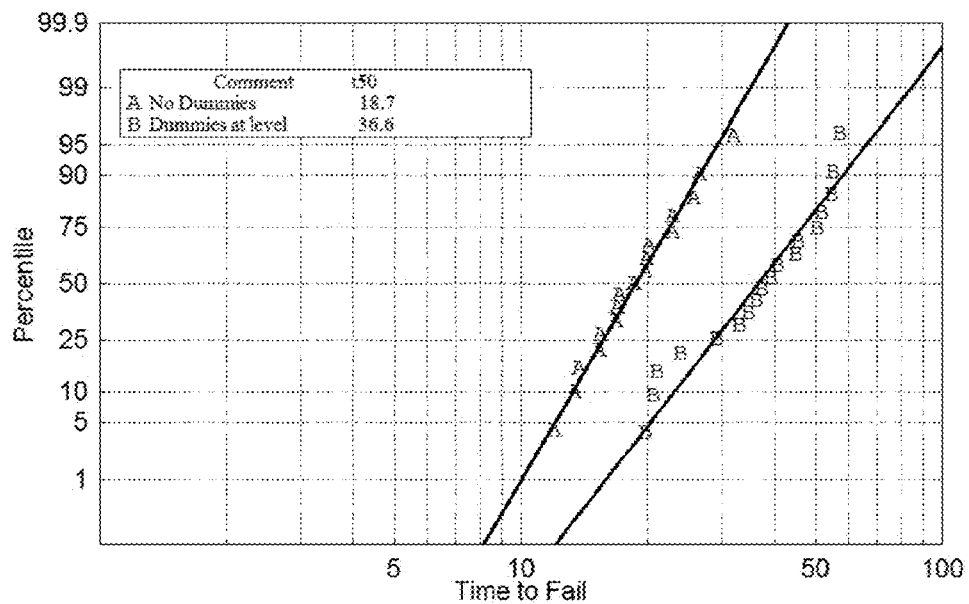
FIG. 5 shows a graph of electromigration (EM) impact, comparing the wiring structure of the present invention to a conventional wiring structure devoid of dummy metal features.

FIG. 5 shows a graph of electromigration (EM) impact, comparing the wiring structure of the present invention to a conventional wiring structure devoid of dummy metal features. In more particularity, the graph of FIG. 5 shows a comparison of the structure of FIG. 3 (with the dimensions noted therein) and a conventional wiring structure devoid of dummy metal features. The conventional wiring structure, otherwise, has the same dimensions as the wiring structure of the present invention.

In FIG. 5, it is shown that the time to failure (EM failure) is significantly increased with wiring structures using the dummy metal features (line B), compared to the wiring structures without the use of the dummy metal features (line A). In fact, as shown in FIG. 5, unexpectedly the use of the dummy metal features provides a 2× increase in EM lifetime. It is theorized that this unexpected result is due to providing a source of additional Cu atoms and/or creating an area of large blocking grains in an otherwise poly crystalline structure to slow down diffusion. In any scenario, it was not intuitive or initially expected that dummy metal features would have any significant impact on EM failure, particularly in view of the known impact on EM for wiring structures using the dummy vias as described in FIG. 6.

Figure 6:
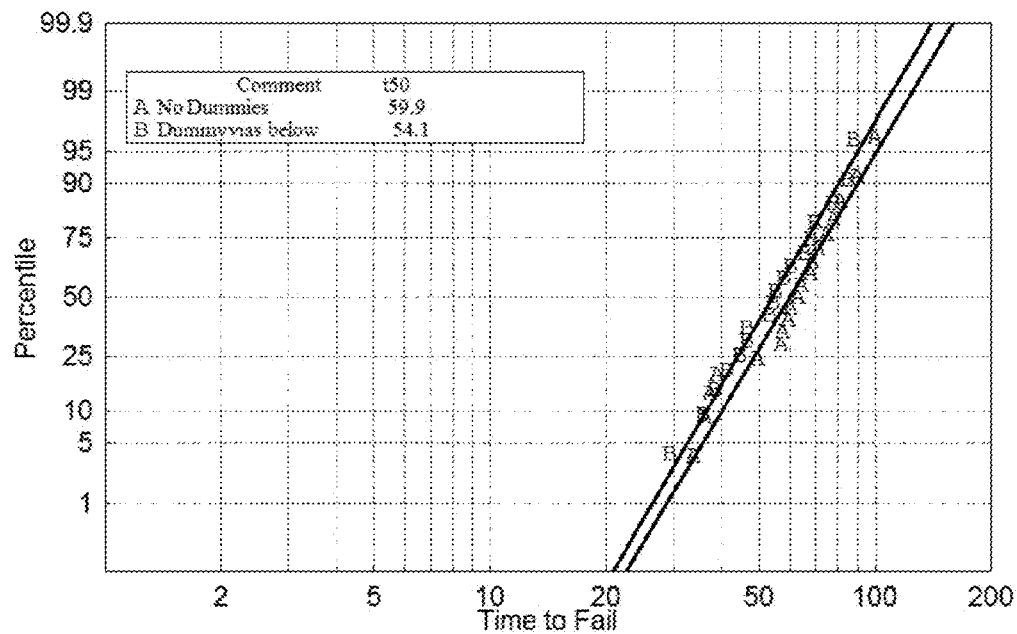
FIG. 6 shows a graph of EM impact, comparing the wiring structure with dummy vias to a conventional wiring structure devoid of any dummy features.

FIG. 6, on the other hand, shows a graph of EM impact, comparing a wiring structure with dummy vias to a conventional wiring structure devoid of any dummy features. In FIG. 6, it is shown that the time to failure (EM failure) is not increased with wiring structures using the dummy vias (line B), compared to the wiring structures without the use of the dummy vias (line A). In fact, the graph of FIG. 6 makes it that more unexpected that the use of dummy metal features of the present invention provides a 2× increase in EM lifetime, as shown in FIG. 5.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure, comprising:
   a metal wiring structure; and
   dummy metal features in electrical and direct physical contact with the metal wiring structure in a same plane as the metal wiring structure, wherein
   the dummy metal features do not change a resistance of the metal wiring structure and which are remote from other wiring structures,
   the dummy metal features extend from opposing sides of the metal wiring structure along a longitudinal axis, and
   the dummy metal features are provided in a staggered arrangement along the opposing sides of the metal wiring structure so that each dummy metal feature of the dummy metal features is a separate structure from the metal wiring structure and a separate structure from other dummy metal features along the opposing sides of the metal wiring structure, each dummy metal feature extending horizontally away from the metal wiring structure and the dummy metal features along the opposing side of the metal wiring structure.

2. The structure of claim 1, wherein the dummy metal features are provided at about 5 micron increments in the staggered arrangement along the opposing sides of the metal wiring structure.

3. The structure of claim 2, wherein the metal wiring structure is at least 10 microns in length.

4. The structure of claim 1, wherein the dummy metal features and the metal wiring structure have a same thickness.

5. The structure of claim 4, wherein the dummy metal features and the metal wiring structure are of a same metal material.

6. The structure of claim 1, wherein the dummy metal features extend on a single side of the metal wiring structure.

7. The structure of claim 1, wherein the metal wiring structure is electrically connected to the other wiring structures at different levels of the integrated circuit.

8. The structure of claim 1, wherein the dummy metal features and the metal wiring structure are in a same wiring layer of the integrated circuit.

9. The structure of claim 1, wherein a wiring resistance of the metal wiring structure is approximately the same as a wiring structure devoid of the dummy metal features.

10. The structure of claim 9, wherein the metal wiring structure has approximately a 2× improvement in electromigration lifetime compared to a wiring structure of a same dimension which is devoid of the dummy metal features.

11. A structure, comprising:
   a metal wiring structure at a predetermined wiring level of an integrated circuit; and
   dummy metal features in electrical and direct physical contact with the metal wiring structure in a same plane as the metal wiring structure, wherein:
   the dummy metal features and the metal wiring structure have a same thickness and are made of a same metal material;
   a wiring resistance of the metal wiring structure is approximately the same as a wiring structure devoid of the dummy metal features;
   the metal wiring structure has approximately a 2× improvement in electromigration lifetime compared to a wiring structure of a same dimension which is devoid of the dummy metal features;
   the dummy metal features provide the integrated circuit with the 2× improvement in electromigration lifetime; and
   the dummy metal features are provided along at least one of opposing sides of the metal wiring structure along a longitudinal axis so that each dummy metal feature of the dummy metal features is a separate structure from the metal wiring structure and a separate structure from other dummy metal features of the metal wiring structure, each dummy metal feature extending horizontally away from the metal wiring structure.

12. The structure of claim 11, wherein the dummy metal features are provided at about 5 micron increments in a staggered arrangement along the opposing sides of the metal wiring structure.

13. The structure of claim 12, wherein:
   the metal wiring structure is at least 10 microns in length;
   a thickness of the dummy metal features and the metal wiring structure is about 60 nm;
   a distance between each of the dummy metal features is about 5 microns;
   a width of each of the dummy metal features is about 32 nm; and a length of each of the dummy metal features is about 5 microns.

14. The structure of claim 11, wherein the dummy metal features extend on a single side of the metal wiring structure.

15. The structure of claim 11, wherein the metal wiring structure is electrically connected to other wiring structures at different wiring levels of the integrated circuit.

16. The structure of claim 11, wherein the dummy metal features are only in direct electrical contact with the metal wiring structure.

17. A method comprising:
   forming a pattern in an opening corresponding to a wiring structure and dummy metal features at a same wiring level; and
   depositing metal material opening corresponding to the wiring structure and the dummy metal features to form the wiring structure and the dummy metal features in a same plane and in direct physical and electrical contact therewith,
   wherein the dummy metal features are provided in a staggered arrangement along opposing sides of the wiring structure along a longitudinal axis so that each dummy metal feature of the dummy metal features is a separate structure from the wiring structure and a separate structure from other dummy metal features along the opposing sides of the wiring structure, and each dummy metal feature is formed extending horizontally away from the wiring structure and the dummy metal features along the opposing side of the wiring structure.

* * * * *